United States Patent
Kim et al.

(10) Patent No.: US 9,520,854 B2
(45) Date of Patent: Dec. 13, 2016

(54) TUNABLE CAPACITOR INTEGRATED ON ONE SEMICONDUCTOR DIE OR ON ONE MODULE

(71) Applicant: HiDeep Inc, Bundang-gu, Seongnam-si, Gyeonggi-do (KR)

(72) Inventors: Bonkee Kim, Seoul (KR); Youngho Cho, Gyeonggi-do (KR); Donggu Im, Daejeon (KR); Bumkyum Kim, Daejeon (KR)

(73) Assignee: HiDeep Inc., Gyeonggi-do (KR)

( * ) Notice: Subject to any disclaimer, the term of this patent is extended or adjusted under 35 U.S.C. 154(b) by 605 days.

(21) Appl. No.: 14/013,235

(22) Filed: Aug. 29, 2013

(65) Prior Publication Data

US 2014/0002208 A1 Jan. 2, 2014

Related U.S. Application Data

(63) Continuation of application No. 13/853,499, filed on Mar. 29, 2013.

(30) Foreign Application Priority Data

Apr. 3, 2012 (KR) .................. 10-2012-0034574

(51) Int. Cl.
H03H 11/28 (2006.01)
H03H 7/38 (2006.01)
(Continued)

(52) U.S. Cl.
CPC ............. *H03H 7/38* (2013.01); *H01L 23/642* (2013.01); *H01L 23/66* (2013.01);
(Continued)

(58) Field of Classification Search
CPC ........... H03H 7/38; H03H 11/28; H01L 23/66; H01L 23/642; H01L 27/0251; H01L 2924/0002; H01L 2223/6655
(Continued)

(56) References Cited

U.S. PATENT DOCUMENTS 6,013,958 A * 1/2000 Aytur .................. H03J 3/185
307/109
6,556,416 B2 * 4/2003 Kunihiro ............. H01F 17/0006
257/E23.062
(Continued)

FOREIGN PATENT DOCUMENTS

EP 1 365 507 11/2003
JP 03-136364 A 6/1991
(Continued)

OTHER PUBLICATIONS

Extended European Search Report issued Apr. 23, 2014; 6 pages.

*Primary Examiner* — Jared Fureman
*Assistant Examiner* — Michael Warmflash
(74) *Attorney, Agent, or Firm* — Foley & Lardner LLP

(57) ABSTRACT

Disclosed is a tunable capacitor. The tunable capacitor according to a first embodiment of the present invention includes: a first capacitor; and a switching transistor which switches on/off the connection of the first capacitor between the first terminal and the second terminal, wherein an on/off operation of the switching transistor is performed by a high signal H and a low signal L. The tunable capacitor according to a second embodiment of the present invention includes: a first capacitor; and a switching transistor which switches on/off the connection of the first capacitor between the first terminal and the second terminal, wherein an on/off operation of the switching transistor is performed by a high signal
(Continued)

H and a low signal L, and wherein the tunable capacitor is integrated on one semiconductor die or on one module.

24 Claims, 9 Drawing Sheets

(51) Int. Cl.
    *H01L 27/02*     (2006.01)
    *H01L 23/64*     (2006.01)
    *H01L 23/66*     (2006.01)

(52) U.S. Cl.
    CPC ......... *H01L 27/0251* (2013.01); *H03H 11/28* (2013.01); *H01L 2223/6655* (2013.01); *H01L 2924/0002* (2013.01)

(58) Field of Classification Search
    USPC .......................................... 307/109; 361/277
    See application file for complete search history.

(56) References Cited

U.S. PATENT DOCUMENTS

| | | | | |
|---|---|---|---|---|
| 7,671,693 | B2* | 3/2010 | Brobston | H03H 7/40 333/17.3 |
| 8,405,467 | B2* | 3/2013 | He | H03H 7/40 333/17.3 |
| 8,432,654 | B2 | 4/2013 | Whitfield et al. | |
| 8,604,864 | B2* | 12/2013 | Ranta | H03M 1/1061 327/427 |
| 2003/0218514 | A1* | 11/2003 | Eckl | H03H 7/0115 333/32 |
| 2007/0194859 | A1 | 8/2007 | Brobston et al. | |
| 2007/0236281 | A1 | 10/2007 | Cicalini | |
| 2011/0002080 | A1* | 1/2011 | Ranta | H03M 1/1061 361/277 |
| 2011/0127849 | A1* | 6/2011 | Yoon | H03J 3/20 307/109 |
| 2011/0227666 | A1* | 9/2011 | Manssen | H03H 5/12 333/32 |
| 2012/0223763 | A1* | 9/2012 | Sawada | H01L 21/8213 327/430 |

FOREIGN PATENT DOCUMENTS

| | | |
|---|---|---|
| JP | 2003-068571 | 3/2003 |
| JP | 2009-533903 A | 9/2009 |
| JP | 2011-519488 A | 7/2011 |
| KR | 10-2005-0020969 A | 3/2005 |
| KR | 10-2008-0011616 A | 2/2008 |

* cited by examiner

TUNABLE CAPACITOR INTEGRATED ON ONE SEMICONDUCTOR DIE OR ON ONE MODULE

CROSS-REFERENCE TO RELATED APPLICATIONS

This application is a Continuation of U.S. patent application Ser. No. 13/853,499, filed on Mar. 29, 2013, which claims priority to Korean Application No. 10-2012-0034574, filed on Apr. 3, 2012, the contents of which are hereby incorporated by reference in their entireties into the present disclosure.

BACKGROUND

Field

The present invention relates to a tunable capacitor capable of tuning a capacitance, and more particularly to a tunable capacitor which is integrated on one semiconductor die or on one module.

Description of Related Art

In general, a radio frequency integrated circuit (RFIC) may use an impedance matching circuit for interfacing mutually different sections within an RFIC network. The impedance matching circuit improves power transfer among the sections or reduces signal reflections occurring among respective sections. For the purpose of enhancing such an impedance matching performance, a tuning matching network is employed. This is a significant issue in a circuit design.

Since parameters of various circuit elements (e.g., inductor, capacitor and the like) depend on many factors, it is difficult to accurately predict the performance of the impedance matching circuit. Therefore, a method has been used, which initially predicts the performance of the impedance matching circuit by using an on-chip circuit element for the purpose of detailed impedance matching, and then determines the validity of the circuit by measuring the result from the initial prediction. However, when the measured result is not satisfied, a new circuit element must be substituted for the circuit element. Therefore, the method is complicated and much process time-consuming. Also, there is a problem that it is difficult to physically replace a circuit element of an integrated circuit placed on a die.

Accordingly, there is a requirement for a tuning circuit capable of performs calibration or impedance matching without replacing the integrated circuit on the die. Meanwhile, in terms of noise or space, it is urgently required to develop a tunable capacitor which is implemented by a capacitor instead of an inductor and is capable of performing the calibration or impedance matching.

SUMMARY

One embodiment is a tunable capacitor including: a variable capacitor unit placed between a first terminal and a second terminal; and a bypass switch which on/off controls a bypass connection between the first terminal and the second terminal. The variable capacitor unit and the bypass switch are integrated on one semiconductor die or on one module.

Another embodiment is a tunable capacitor including a tuning switch which on/off controls a connection between the variable capacitor unit and an impedance tuner connected in parallel to at least one of both terminals of the variable capacitor unit. The variable capacitor unit and the tuning switch are integrated on one semiconductor die or on one module.

The tunable capacitor may include a tuning switch which on/off controls a connection between the variable capacitor unit and an impedance tuner connected in parallel to at least one of both terminals of the variable capacitor unit. The variable capacitor unit, the bypass switch and the tuning switch may be integrated on one semiconductor die or on one module.

The variable capacitor unit may include at least one of a variable capacitor of which the capacitance is controlled by current or voltage and a MEMS variable capacitor.

The variable capacitor unit may include a first capacitor; and a switching transistor which switches on/off the connection of the first capacitor between the first terminal and the second terminal.

When the switching transistor is in the on-state, a high signal H may be applied to a gate terminal G, and a low signal L may be applied to a body terminal B, a drain terminal D and a source terminal S. When the switching transistor is in the off-state, the low signal L may be applied to the gate terminal G and the body terminal B, and the high signal H may be applied to the drain terminal D and the source terminal S.

The switching transistor may be a stacked transistor formed by connecting in series a plurality of transistors.

The gate terminal G and the body terminal B of the switching transistor may be connected in series to a resistance respectively.

The first capacitor may be formed by connecting in series or in parallel a plurality of the capacitors.

An on/off operation of the switching transistor may be performed by a high signal H and a low signal L.

The tunable capacitor may include a plurality of the variable capacitor units. The plurality of the variable capacitor units may be connected in parallel to each other. Each of the plurality of the variable capacitor units may include the first capacitor and the switching transistor which switches on/off the connection of the first capacitor between the first terminal and the second terminal.

An equivalent capacitance of the plurality of the variable capacitor units may be $2^{m-1} \times C1$ (here, m is a natural number less than or equal to n). Width-to-length ratios W/L of the switching transistors of the plurality of the variable capacitor units may be $2^{m-1} \times W1$ (here, m is a natural number less than or equal to n) respectively. The n may be a number of the variable capacitor units. The C1 may be an equivalent capacitance of a particular variable capacitor unit. The W1 may be a channel width-to-length ratio W/L of the switching transistor.

The tunable capacitor may further include a fixed capacitor which is connected in parallel to a plurality of the tunable capacitors.

The tunable capacitor may further include a controller which receives a digital control signal and controls on/off of the switching transistor.

An on/off operation of the switching transistor may be performed by a high signal H and a low signal L.

DETAILED DESCRIPTION

Figure 1:
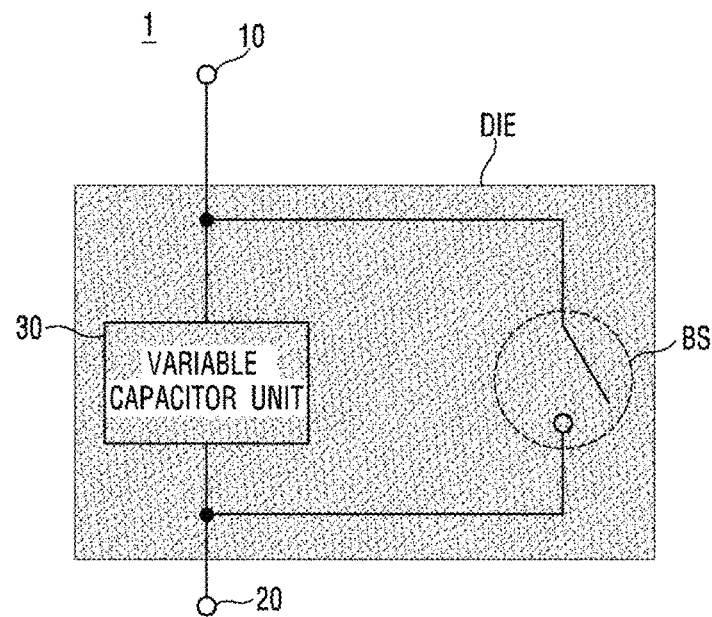
FIG. 1 is a brief view showing a structure of a tunable capacitor including a bypass switch in accordance with a first embodiment of the present invention.

The following detailed description of the present invention shows a specified embodiment of the present invention and will be provided with reference to the accompanying drawings. The embodiment will be described in enough detail that those skilled in the art are able to embody the present invention. It should be understood that various embodiments of the present invention are different from each other and need not be mutually exclusive. For example, a specific shape, structure and properties, which are described in this disclosure, may be implemented in other embodiments without departing from the spirit and scope of the present invention with respect to one embodiment. Also, it should be noted that positions or placements of individual components within each disclosed embodiment may be changed without departing from the spirit and scope of the present invention. Therefore, the following detailed description is not intended to be limited. If adequately described, the scope of the present invention is limited only by the appended claims of the present invention as well as all equivalents thereto. Similar reference numerals in the drawings designate the same or similar functions in many aspects.

Prior to the description of a tunable capacitor according to an embodiment of the present invention, when it is assumed that a positive voltage applied to a transistor is VDD in a case where the transistor is an on-state with regard to a voltage signal applied to the transistor, it means that a high signal H has a voltage of about VDD/2 to VDD and a low signal L has a voltage of 0V (i.e., a ground signal) to about VDD/2. A standard for dividing the voltage signal applied to the transistor into the high signal H and the low signal L is not necessarily fixed. The standard may be changed according to an implementation environment of the tunable capacitor according to the embodiment of the present invention, for example, a magnitude of the applied positive voltage VDD or the characteristics of the transistor and the like.

Hereafter, a tunable capacitor according to a first embodiment of the present invention will be described with reference to the accompanying drawings.

First Embodiment

FIG. 1 is a view showing a tunable capacitor 1 according to a first embodiment of the present invention.

Referring to FIG. 1, the tunable capacitor 1 according to the embodiment of the present invention may include a variable capacitor unit 30 placed between a first terminal 10 and a second terminal 20, and a bypass switch BS which bypasses between the first terminal 10 and the second terminal 20.

Specifically, one and the other ends of the variable capacitor unit 30 of the tunable capacitor 1 according to the embodiment of the present invention are connected to the first terminal 10 and the second terminal 20 respectively. The bypass switch BS is connected in parallel to the variable capacitor unit 30 between the first and the second terminals 10 and 20.

The first terminal 10 may be a load line unit connected to a load. The second terminal 20 may be a ground terminal connected to the ground. For another example, the first terminal 10 may be an RF+ terminal connected to an RF input port. The second terminal 20 may be an RF− terminal connected to an RF output port. Besides, the first and the second terminals 10 and 20 may be used as a terminal having another form by a person having ordinary skill in the art.

The tunable capacitor 1 according to the embodiment of the present invention has a normal mode and a bypass mode. The bypass switch BS receives a control signal and on/off controls the bypass connection between the first terminal 10 and the second terminal 20. That is, when the bypass switch BS becomes in an on-state, the tunable capacitor 1 operates in the bypass mode. The first terminal 10 and the second terminal 20 are bypass-connected to each other, so that a signal between the first terminal 10 and the second terminal 20 flows along a bypass path. Contrary to this, when the bypass switch BS becomes in an off-state, the tunable capacitor 1 operates in the normal mode. That is, the bypass path between the first terminal 10 and the second terminal 20 is blocked, so that the signal between the first terminal 10 and the second terminal 20 flows through the variable capacitor unit 30.

Since the tunable capacitor 1 according to the first embodiment of the present invention includes the bypass switch BS between the first terminal 10 and the second terminal 20, it is easy to perform calibration for a circuit, a device or the like which can be connected to the both terminals 10 and 20 of the tunable capacitor 1. In other words, even after the tunable capacitor 1 is integrated on a semiconductor die, etc., it is easy to test or measure in the bypass mode for the purpose of the calibration for circuits, devices and the like other than the variable capacitor unit 30.

The variable capacitor unit 30 is able to control capacitance in accordance with an external control signal. For example, the variable capacitor unit 30 according to the embodiment of the present invention may include at least one capacitor which is connected in series or in parallel thereto, and then a corresponding capacitor is selected according to the external control signal. However, the variable capacitor unit 30 according to the embodiment of the present invention is not necessarily limited to this. Any structure capable of controlling the capacitance can be included in the variable capacitor unit 30 of the present invention. A concrete implementation example of the variable capacitor unit 30 will be described later in detail.

Meanwhile, according to the embodiment of the present invention, the capacitor unit 30 and the bypass switch BS are integrated on one semiconductor die. Specifically, the tunable capacitor 1 can be implemented as one chip or one module by integrating the capacitor unit 30 and the bypass switch BS on one semiconductor die. By doing this, the number of chips or modules required for implementing the tunable capacitor 1 is reduced. Accordingly, the entire size of the tunable capacitor 1 is reduced. Also, since the tunable capacitor 1 is implemented as one module, the operating speed and reliability of the tunable capacitor 1 are increased. That is, the tunable capacitor 1 is advantageous in space utilization and has a shortened production process. Thus, manufacturing time and manufacturing cost can be reduced. Additionally, the tunable capacitor 1 requires less wiring and becomes smaller, and thus reduces power consumption.

Next, a tunable capacitor according to a second embodiment of the present invention will be described.

Figure 2A:
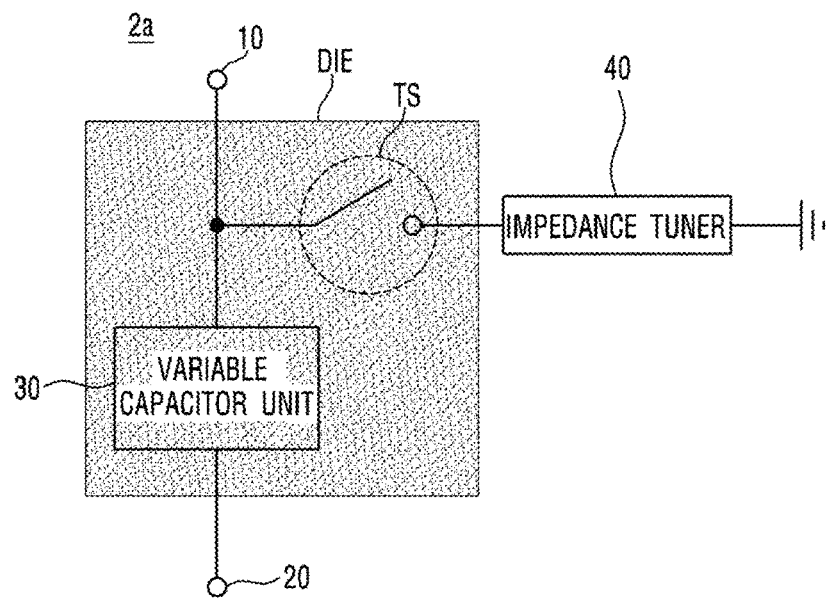
FIGS. 2a and 2b are brief views showing structures of tunable capacitors including an impedance tuner accordance with a second embodiment of the present invention.
Figure 2B:
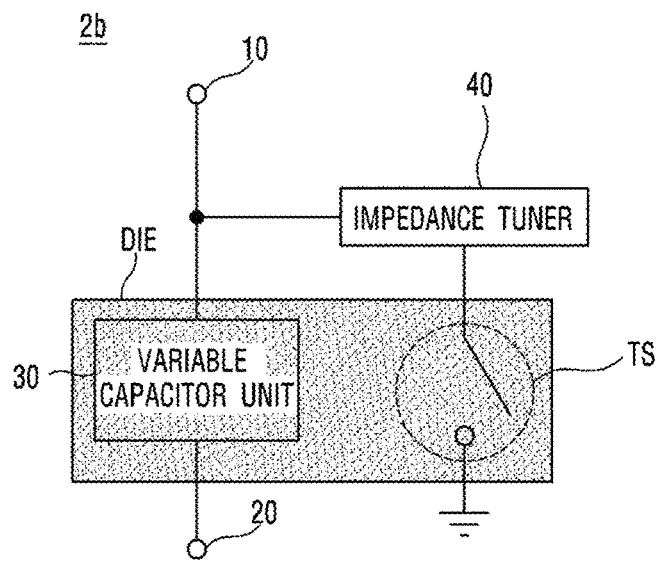

FIGS. 2a and 2b are brief views showing structures of tunable capacitors 2a and 2b accordance with the second embodiment of the present invention.

Referring to FIGS. 2a and 2b, the tunable capacitors 2a and 2b according to the embodiment of the present invention may include a variable capacitor unit 30 placed between a first terminal 10 and a second terminal 20, and a tuning switch TS which on/off controls the connection between the variable capacitor unit 30 and an impedance tuner 40 connected in parallel to at least one of both terminals of the variable capacitor unit 30.

The variable capacitor unit 30 is the same as the variable capacitor unit 30 according to the first embodiment shown in FIG. 1. Therefore, a detailed description thereof will be omitted.

As shown in FIGS. 2a and 2b, the tuning switch TS on/off controls the connection between the variable capacitor unit 30 and the impedance tuner 40. The impedance tuner 40 can tune the impedance in such a manner as to impedance match a capacitance determined by the variable capacitor unit 30. Therefore, the impedance tuner 40 may include an inductor which is an inductive element and impedance matches the capacitor, i.e., a capacitive element.

Accordingly, the tuning switch TS on/off controls the connection between the impedance tuner 40 and the tunable capacitors 2a and 2b according to the embodiment of the present invention, so that the impedance matching can be accomplished between the first terminal 10 and the second terminal 20.

Meanwhile, according to the embodiment of the present invention, the variable capacitor unit 30 and the tuning switch TS are integrated on one semiconductor die or on one module. Specifically, the tunable capacitors 2a and 2b can be implemented as one chip or one module by integrating the capacitor unit 30 and the tuning switch TS on one semiconductor die. The effects of the tunable capacitor integrated on one semiconductor die or on one module are the same as those of the first embodiment shown in FIG. 1. Therefore, a detailed description thereof will be omitted.

While FIGS. 2a and 2b show that the impedance tuner 40 is connected between the first terminal 10 and the ground terminal, the impedance tuner 40 is not necessarily limited to this. The impedance tuner 40 may be also connected between the second terminal 20 and the ground terminal.

Next, a tunable capacitor according to a third embodiment of the present invention will be described.

Third Embodiment

Figure 3A:
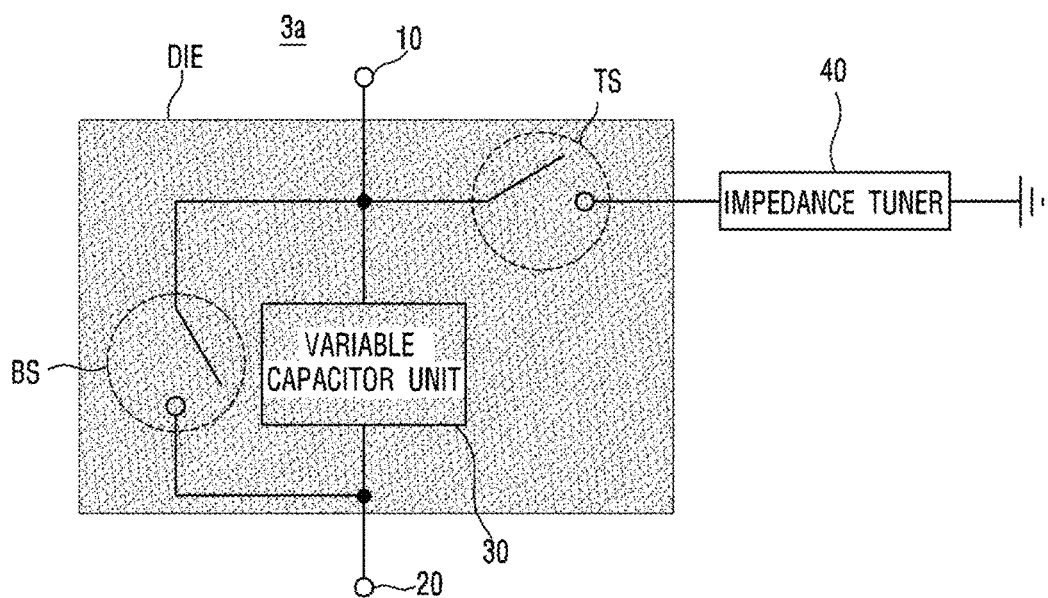
FIGS. 3a and 3b are block diagrams showing structures of tunable capacitors including a bypass switch and an impedance tuner according to a third embodiment of the present invention.
Figure 3B:
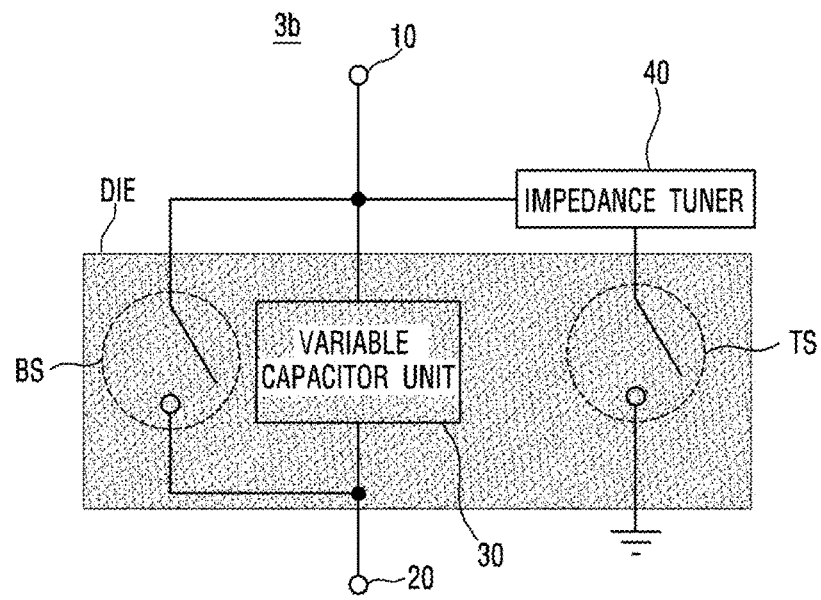

FIGS. 3a and 3b are block diagrams showing tunable capacitors according to the third embodiment of the present invention.

Referring to FIGS. 3a and 3b, tunable capacitors 3a and 3b according to the third embodiment may include the bypass switch (BS) described in the first embodiment and the tuning switch TS described in the second embodiment.

As shown in FIGS. 3a and 3b, since the configurations of the switches according to the embodiments have been already described in the first and the second embodiments respectively, detailed descriptions will be omitted.

According to the embodiment, in the bypass mode where the bypass switch BS is in the on-state, the calibration for circuits, devices or the like connected to the first terminal 10 or the second terminal 20 can be performed by the bypass connection between the first terminal 10 and the second terminal 20. Also, in the normal mode where the bypass switch BS is in the off-state, the connection between the variable capacitor unit 30 and the impedance tuner 40 can be controlled according to the on/off control of the tuning switch TS.

Meanwhile, though FIGS. 3a and 3b show that the impedance tuner 40 is connected between the first terminal 10 and the ground terminal, the impedance tuner 40 is not necessarily limited to this. The impedance tuner 40 may be also connected between the second terminal 20 and the ground terminal.

Besides, the tunable capacitors 3a and 3b according to the third embodiment are integrated on one semiconductor die. Since subsequent effects to this have been already described in the foregoing first and the second embodiments, detailed descriptions thereof will be omitted.

Hereafter, a concrete implementation example of the variable capacitor unit 30 will be described.

Figure 4:
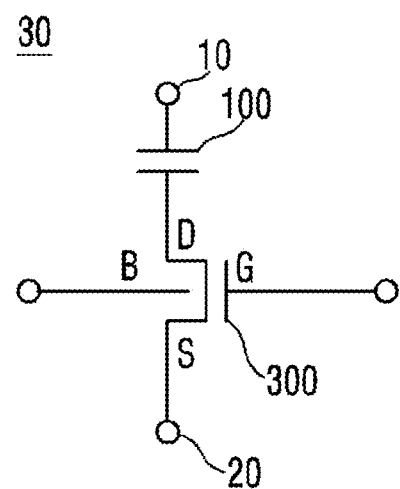
FIG. 4 is a circuit diagram showing a tunable capacitor according to an embodiment of the present invention.

FIG. 4 shows a variable capacitor unit according to an embodiment of the present invention.

Referring to FIG. 4, the variable capacitor unit 30 according to the embodiment of the present invention includes a first capacitor 100 placed between the first terminal 10 and the second terminal 20, and a switching transistor 300 which switches on/off the connection of the first capacitor 100 between the first terminal 10 and the second terminal 20.

Specifically, one and the other ends of the first capacitor 100 of the variable capacitor unit 30 according to the embodiment of the present invention are connected to the first terminal 10 and the switching transistor 300 respectively. One and the other end of the switching transistor 300 are connected to the first capacitor 100 and the second terminal 20 respectively.

The switching transistor 300 receives a control signal and controls the on/off of the variable capacitor unit 30 corresponding to the control signal. In other words, the corresponding variable capacitor unit 30 may or may not be selected between the first terminal 10 and the second terminal 20. A variety of semiconductor devices may be used as the switching transistor 300.

In the meantime, though FIG. 4 shows the variable capacitor unit according to the switching control, the variable capacitor unit according to the embodiment of the present invention is not necessarily limited to this. For instance, the variable capacitor unit may include a variable capacitor of which the capacitance is controlled by current or voltage, or a MEMS variable capacitor manufactured in a micro electro mechanical system (MEMS) manner or may include any combination of them.

Figure 5A:
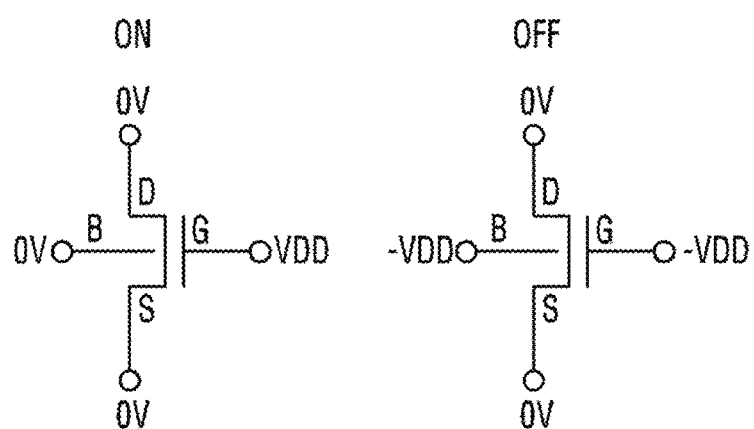
FIG. 5a is a brief view showing a variable capacitor unit which uses a negative voltage.

FIG. 5a shows the operation of the variable capacitor unit 30 using a negative voltage.

As shown in FIG. 5a, for the purpose of the on/off operation of the switching transistor, when the switching transistor is in the on-state, a gate-source voltage (VGS) and a gate-drain voltage (VGD) are positive voltages VDD, and a body-source voltage (VBS) and a body-drain voltage (VBD) are 0V. Contrary to this, when the switching transistor is in the off-state, the gate-source voltage (VGS) and the gate-drain voltage (VGD) are negative voltages −VDD, and the body-source voltage (VBS) and the body-drain voltage (VBD) are also negative voltages −VDD. This intends to improve high power handling capability and linearity of the variable capacitor unit 30.

Specifically, when the switching transistor is in the on-state, a signal of 0V (GND) is applied to a drain terminal D, a source terminal S and a body terminal B of the switching transistor, and a signal of the positive voltage VDD is applied to a gate terminal G. Contrary to this, when the switching transistor is in the off-state, the signal of 0V (GND) is applied to the drain terminal D and the source terminal S, and a signal of the negative voltage −VDD is applied to the gate terminal G and the body terminal B. That is, the gate-source voltage (VGS) and the gate-drain voltage (VGD) have a negative value. Therefore, the signal of the negative voltage −VDD is transmitted for the purpose of the on/off operation of the switching transistor 300.

Hereafter, the operation of the switching transistor 300 of the variable capacitor unit 30 according to the embodiment of the present invention will be described in detail.

FIG. 5 shows the on/off state of the switching transistor of the variable capacitor unit which does not use the negative voltage.

Figure 5B:
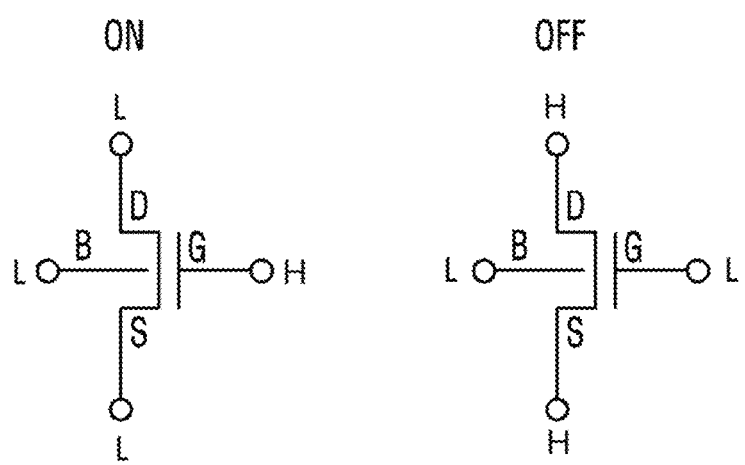
FIG. 5b is a brief view showing a variable capacitor unit which does not use the negative voltage.

Referring to FIG. 5b, in the switching transistor 300 of the variable capacitor unit 30 according to the embodiment of the present invention, the drain terminal D may be connected to the first capacitor 100, and the source terminal S may be connected to the second terminal 20. The switching transistor 300 functions to switch on/off the first capacitor 100. Due to the characteristics of the transistor, the switching transistor 300 may be reversely connected between the first terminal 10 and the second terminal 20. That is, the source terminal S of the switching transistor 300 may be connected to the first capacitor 100, and the drain terminal D may be connected to the second terminal 20. For convenience of description in the embodiment of the present invention, a case where the drain terminal D of the switching transistor 300 is connected to the first capacitor 100 will be taken as an example for description.

First, when the switching transistor 300 is in the on-state, the high signal H is applied to the gate terminal G, and the low signal L is applied to the drain terminal D, the source terminal S and the body terminal B. However, when the switching transistor 300 is in the off-state, the low signal L is applied to the gate terminal G and the body terminal B of the switching transistor 300, and the high signal H is applied to the drain terminal D and the source terminal S.

The operation of the switching transistor 300 according to the embodiment of the present invention is determined by the gate-drain voltage (VGD) of an electric potential difference between the gate terminal G and the drain terminal D, the gate-source voltage (VGS) of an electric potential difference between the gate terminal G and the source terminal S, the body-drain voltage (VBD) of an electric potential difference between the body terminal B and the drain terminal D, and the body-source voltage (VBS) of an electric potential difference between the body terminal B and the source terminal S.

Referring to FIGS. 4 to 5b, when the switching transistor which uses the negative voltage and the switching transistor 300 which does not use the negative voltage are in the on-state, voltages applied to the respective terminals are the same as each other, and thus the operations of them are also the same as each other. On the contrary to this, when they are in the off-state, voltages applied to the respective terminals are different from each other. However, when they are in the off-state, the gate-drain voltage (VGD) and the gate-source voltage (VGS) are the same as the negative value of −VDD, and the body-drain voltage (VBD) and the body-source voltage (VBS) are the same as the negative value of −VDD. Consequently, the operations of the two switching transistors are the same as each other.

In other words, regarding the variable capacitor unit 30 of the tunable capacitor 1, despite the fact that the voltages applied to the respective terminals of the switching transistor 300 which does not use the negative voltage are different from the voltages applied to the respective terminals of the switching transistor which uses the negative voltage, the electric potential differences between the respective terminals are the same as each other, so that the two switching transistors perform the same operation. Accordingly, the tunable capacitor 1 according to the embodiment of the present invention shown in FIG. 5b does not use the negative voltage and is able to maintain the same power handling capability and linearity as those of the tunable capacitor using the negative voltage.

Therefore, the tunable capacitor 1 according to the embodiment of the present invention may include the variable capacitor unit using the negative voltage. However, it is recommended that the tunable capacitor 1 should include the variable capacitor unit 30 which has excellent power handling capability and linearity and does not use the negative voltage.

Figure 6:
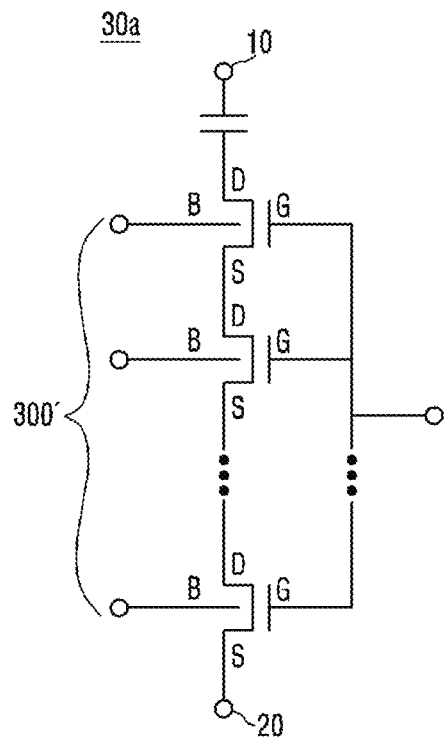
FIG. 6 is a circuit diagram showing a variable capacitor unit according to another embodiment of the present invention.

FIG. 6 shows a variable capacitor unit according to another embodiment of the present invention.

Referring to FIG. 6, a switching transistor 300' of the variable capacitor unit 30a may be formed to have a structure in which the plurality of transistors are in series connected. To use a stacked transistor formed by connecting in series the plurality of the transistors instead of a single transistor is advantageous in improving the power handling capability and linearity of the tunable capacitor. Control signals applied to the respective transistors are the same as each other and the on/off operations of the respective transistors are performed in the same manner. Since the stacked transistor is a publicly known art, a detailed description thereof will be omitted.

Figure 7:
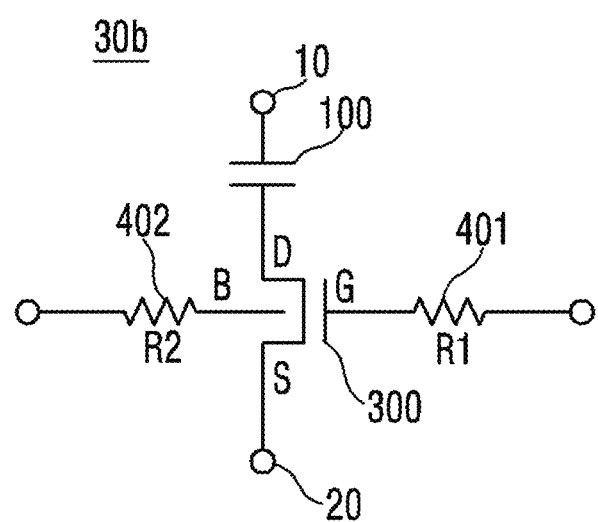
FIG. 7 is a circuit diagram showing a variable capacitor unit according to further another embodiment of the present invention.

FIG. 7 shows the variable capacitor unit according to further another embodiment of the present invention.

Referring to FIG. 7, a gate terminal G and a body terminal B of the switching transistor 300 may be connected to a first resistance 401 and a second resistance 402 respectively.

As shown in FIG. 7, the gate terminal G of the switching transistor 300 of a variable capacitor unit 30b may be connected to the first resistance (R1) 401 and the body terminal B may be connected to the second resistance (R2) 402. Even though a signal having a large amplitude is applied to the drain terminal and the source terminal when the switching transistor 300 becomes in the on-state, the first resistance (R1) 401 connected to the gate terminal G and the second resistance (R2) 402 intend to cause the switching transistor 300 to be always in the on-state without being turned off. That is, it is possible to prevent the switching transistor 300 from being in the off-state during the process of swinging an inputted on-signal. Similarly, when an off-signal is inputted, the switching transistor 300 can be prevented from being in the on-state.

Figure 8:
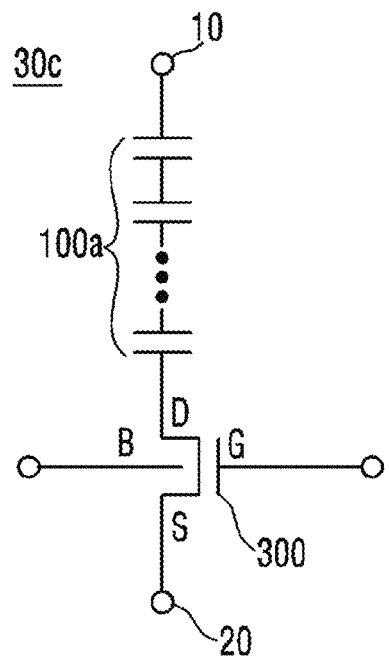
FIG. 8 is a circuit diagram showing a variable capacitor unit according to yet another embodiment of the present invention.

FIG. 8 shows a variable capacitor unit according to yet another embodiment of the present invention.

Referring to FIG. 8, a first capacitor 100*a* has a stacked structure formed by connecting in series the plurality of capacitors.

As shown in FIG. 8, a first capacitor 100*a* of a variable capacitor unit 30*c* may be a stacked capacitor obtained by connecting in series the capacitors. This intends to enhance an effective breakdown voltage of the capacitor. The variable capacitor unit 30*c* according to the embodiment of the present invention may be used in a smaller and lighter electronic device and the like. Also, the variable capacitor unit 30*c* is advantageous for processing a radio frequency signal.

Figure 9:
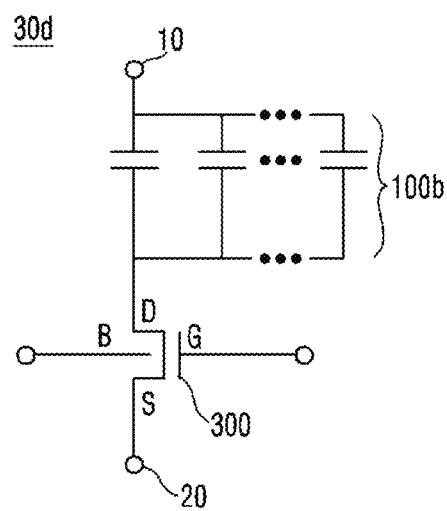
FIG. 9 is a circuit diagram showing a variable capacitor unit according to still another embodiment of the present invention.

FIG. 9 shows a variable capacitor unit according to still another embodiment of the present invention.

Referring to FIG. 9, a first capacitor 100*b* of a variable capacitor unit 30*d* has a structure formed by connecting in parallel the plurality of capacitors As shown in FIG. 9, the first capacitor 100*b* can be implemented by connecting in parallel the plurality of the capacitors. Since the capacitance of the first capacitor 100*b* is increased due to the parallel connection of the capacitors, a tunable capacitor having a large capacitance can be created.

As such, the variable capacitor unit 30 according to the embodiment of the present invention includes the first capacitor 100 and the switching transistor 300. The variable capacitor units 30*a* and 30*b* can be implemented by using the stacked transistor as the switching transistor 300 of the variable capacitor unit 30 or by connecting resistances to the gate terminal G and the body terminal B. The variable capacitor units 30*c* and 30*d* can be implemented by stacking the first capacitors 100 or by connecting in parallel a plurality of the first capacitors 100.

Figure 10A:
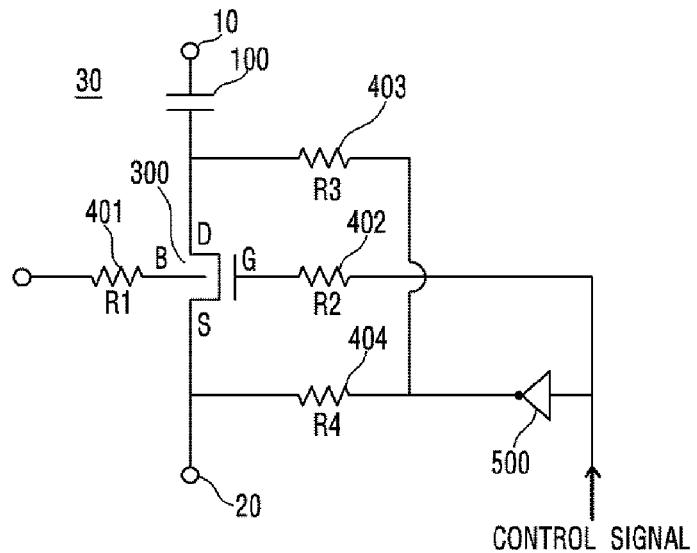
FIG. 10a is a circuit diagram showing the variable capacitor unit according to an embodiment of the present invention.
Figure 10B:
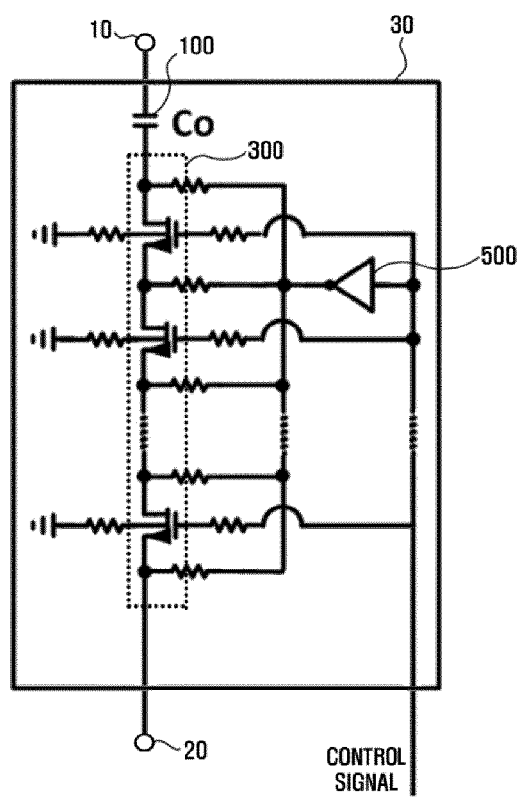
FIG. 10b is a circuit diagram showing the implemented variable capacitor unit.

FIG. 10*a* is a brief view showing the variable capacitor unit 30 according to the embodiment of the present invention. FIG. 10*b* is a circuit diagram showing the concretely implemented variable capacitor unit 30.

Referring to FIG. 10*a*, the variable capacitor unit 30 according to the embodiment of the present invention includes the first capacitor 100 placed between the first terminal 10 and the second terminal 20, and the switching transistor 300 which switches on/off the connection of the first capacitor 100 between the first terminal 10 and the second terminal 20.

The on/off operation of the switching transistor 300 of the variable capacitor unit 30 according to the embodiment of the present invention is performed by the low signal L and the high signal H without using the negative voltage. The signal applied to the gate terminal G of the switching transistor 300 is converted, and then the converted signal is applied to the drain terminal D and the source terminal S of the switching transistor 300.

Specifically, one and the other ends of the first capacitor 100 of the variable capacitor unit 30 according to the embodiment of the present invention are connected to the first terminal 10 and the switching transistor 300 respectively. One and the other end of the switching transistor 300 are connected to the first capacitor 100 and the second terminal 20 respectively.

The on/off operation of the switching transistor 300 of the variable capacitor unit 30 according to the embodiment of the present invention is performed by the ground signal and a positive voltage signal. For this, the variable capacitor unit 30 may further include a converter 500 which generates a control signal applied to the drain terminal D and the source terminal S of the switching transistor 300. The converter 500 converts an input signal applied to the gate terminal G of the switching transistor 300 and applies the converted signal to the drain terminal D and the source terminal S of the switching transistor 300. A resistance may be connected in series to the body terminal B and the gate terminal G of the switching transistor 300. A third resistance (R3) 403 and a fourth resistance (R4) 404 may be inserted between the converter 500 and both of the drain terminal D and the source terminal S. The third resistance (R3) 403 and the fourth resistance (R4) 404 are able to prevent signal loss of the converter.

As shown in FIG. 10*a*, the converter 500 converts the voltage respectively applied to the drain terminal D and the source terminal S of the switching transistor 300 and causes the voltage to be opposite to the voltage applied to the gate terminal G. An inverter, etc., capable of converting the inputted control signal may be used as the converter 500.

Hereafter, in the variable capacitor unit 30 of the tunable capacitor 1, a method for controlling the on/off operation of the first capacitor 100 by the voltage applied to the switching transistor 300 by the converter 500 will be described.

First, the operation in the on-state will be described. An external control signal is applied to the respective gate terminals G of the switching transistor 300. Also, the control signal is converted by the converter 500 and may be applied to the drain terminal D and the source terminal S of the switching transistor 300. In other words, when the control signal is in the on-state, the high signal H is applied to the gate terminal G of the switching transistor 300 and the low signal L is applied to the drain terminal D and the source terminal S. Therefore, the gate-source voltage (VGS) and the gate-drain voltage (VGD) have a positive value, so that the switching transistor 300 becomes in the on-state. Accordingly, the first capacitor 100 is selected between the first terminal 10 and the second terminal 20.

Next, the operation in the off-state will be described. An off-signal is applied as a control signal from the outside, the low signal L is applied to the gate terminal G of the switching transistor 300 and the high signal H is applied to the drain terminal D and the source terminal S. Here, since the gate-source voltage (VGS) and the gate-drain voltage (VGD) have a negative value, the switching transistor 300 becomes in the off-state and performs an open operation between the first terminal 10 and the second terminal 20, so that the corresponding variable capacitor unit is not selected.

According to the embodiment of the present invention, the low signal L is applied to the body terminal B in an on/off state of the on/off switching transistor 300.

FIG. 10*b* is a circuit diagram showing the actually implemented variable capacitor unit of FIG. 10*a*. FIG. 10*b* also shows an example in which the switching transistor 300 is implemented by the stacked transistor.

As such, according to the embodiment of the present invention, it is possible to on/off control the switching transistor 300 only by the positive voltage signal VDD and the negative voltage signal is not required. Therefore, there is an effect that a negative voltage generating circuit which has cost and efficiency disadvantages is not necessarily implemented.

Next, the variable capacitor unit formed by connecting in parallel a plurality of the variable capacitors will be described.

Figure 11:
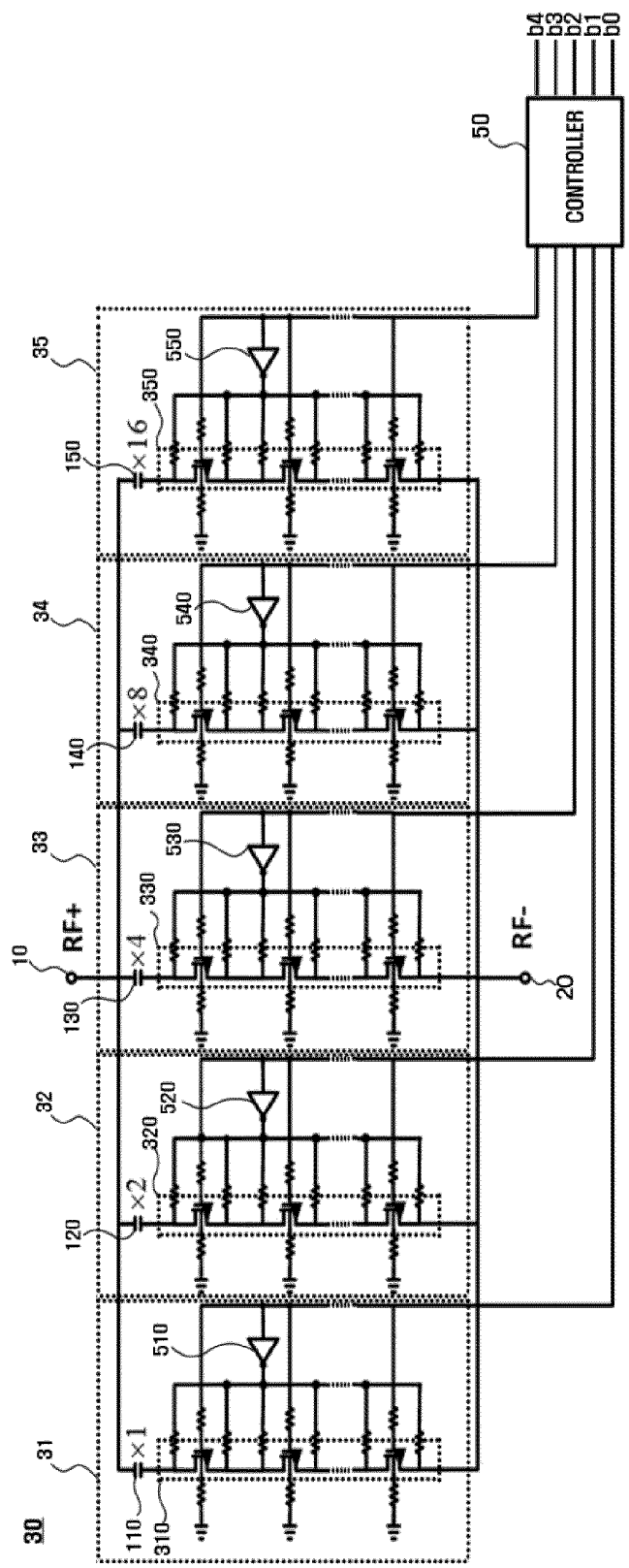
FIG. 11 is a circuit diagram showing a variable capacitor unit according to an embodiment of the present invention.

FIG. 11 is a circuit diagram showing the variable capacitor unit 30 according to an embodiment of the present invention.

Referring to FIG. 11, the variable capacitor unit 30 according to the embodiment of the present invention may include a plurality of variable capacitors 31, 32, 33, 34 and 35 which are connected in parallel to each other and are placed between the first terminal 10 and the second terminal 20. The variable capacitor unit 30 may further include a controller 50 controlling the variable capacitor unit 30.

In the embodiment of the present invention, although the variable capacitor unit including five variable capacitors will be described for convenience of description, the number of the variable capacitors connected in parallel may be changed according to the variation range to be implemented of the variable capacitor unit. In the embodiment, the first terminal 10 may function as an RF+ terminal and the second terminal 20 may function as an RF− terminal.

The variable capacitors 31, 32, 33, 34 and 35 include first capacitors 110, 120, 130, 140 and 150 and switching transistors 310, 320, 330, 340 and 350 respectively.

As shown in FIG. 11, capacitances of the first capacitors 110, 120, 130, 140 and 150 of the variable capacitors 31, 32, 33, 34 and 35, channel width-to-length ratios W/L of the switching transistors 310, 320, 330, 340 and 350, gate resistances and body resistances may be set as mutually different values.

For this purpose, a weight may be applied to the capacitances of the first capacitors 110, 120, 130, 140 and 150, the channel width-to-length ratios W/L of the switching transistors 310, 320, 330, 340 and 350, the gate resistances and the body resistances.

For example, when the first variable capacitor 31 shown in FIG. 11 is a least significant capacitor (LSC) having the minimum weight, the weight of the next variable capacitor 32 may be set twice as much as that of the least significant capacitor (LSC) 31. When the weight becomes twice, the capacitance of the first capacitor 120, and the channel width-to-length ratios W/L of the switching transistor 320 become twice as much as the capacitance of the first capacitor 110 of the least significant capacitor (LSC) 31, and the channel width-to-length ratios W/L of the switching transistor 310 respectively.

Similarly, the weight of the next variable capacitor 33 may be set four times as much as that of the least significant capacitor (LSC) 31. In this manner, the fifth variable capacitor 35, i.e., the last variable capacitor corresponds to a most significant capacitor (MSC) having the maximum weight. The weight becomes 16 times ($=2^{(5-1)}$). Therefore, if the number of the variable capacitors is n, the weights of the respective variable capacitors 31, 32, 33, 34 and 35 may become $2^{(m-1)}$ (here, m is a natural number less than or equal to n).

For example, among output signals of the controller 50, when only the control signal inputted to the least significant capacitor (LSC) 31 is the high signal H and the control signals transmitted to the other variable capacitors 32, 33, 34 and 35 are the low signal L, the high signal H is applied to the gate terminal G of the switching transistor 310 of the least significant capacitor (LSC) 31, and the high signal H of the controller 50 is converted into the low signal L by a converter 510 and is applied to the drain terminal D and the source terminal S. Accordingly, the switching transistor 310 of the least significant capacitor (LSC) 31 becomes in the on-state. However, the switching transistors 320, 330, 340 and 350 of the other variable capacitors 32, 33, 34 and 35 become in the off-state. Therefore, the capacitance between the first terminal 10 and the second terminal 20 is varied to the capacitance of the first capacitor 110.

Therefore, if the capacitance of the least significant capacitor (LSC) 31 is 1 pF, the capacitance of the variable capacitor unit 30 may be variable from minimally 1 pF to maximally 31 pF.

Meanwhile, when the variable capacitor unit 30 is controlled by the controller 50, digital control signals b0, b1, b2, b3 and b4 are applied to the controller 50, and then the controller 50 may output a control signal corresponding to the digital control signals. Here, the variable capacitor unit 30 is able to perform a 5-bit digital control. In other words, as the digital control signals b0, b1, b2, b3 and b4 are changed into the low signal or the high signal, the respective switching transistors 310, 320, 330, 340 and 350 are on/off controlled, so that the tuning may be digitally performed. Therefore, when the number of the variable capacitors is n, the variable capacitor unit 30 is capable of performing n-bit digital tuning operation.

Figure 12:
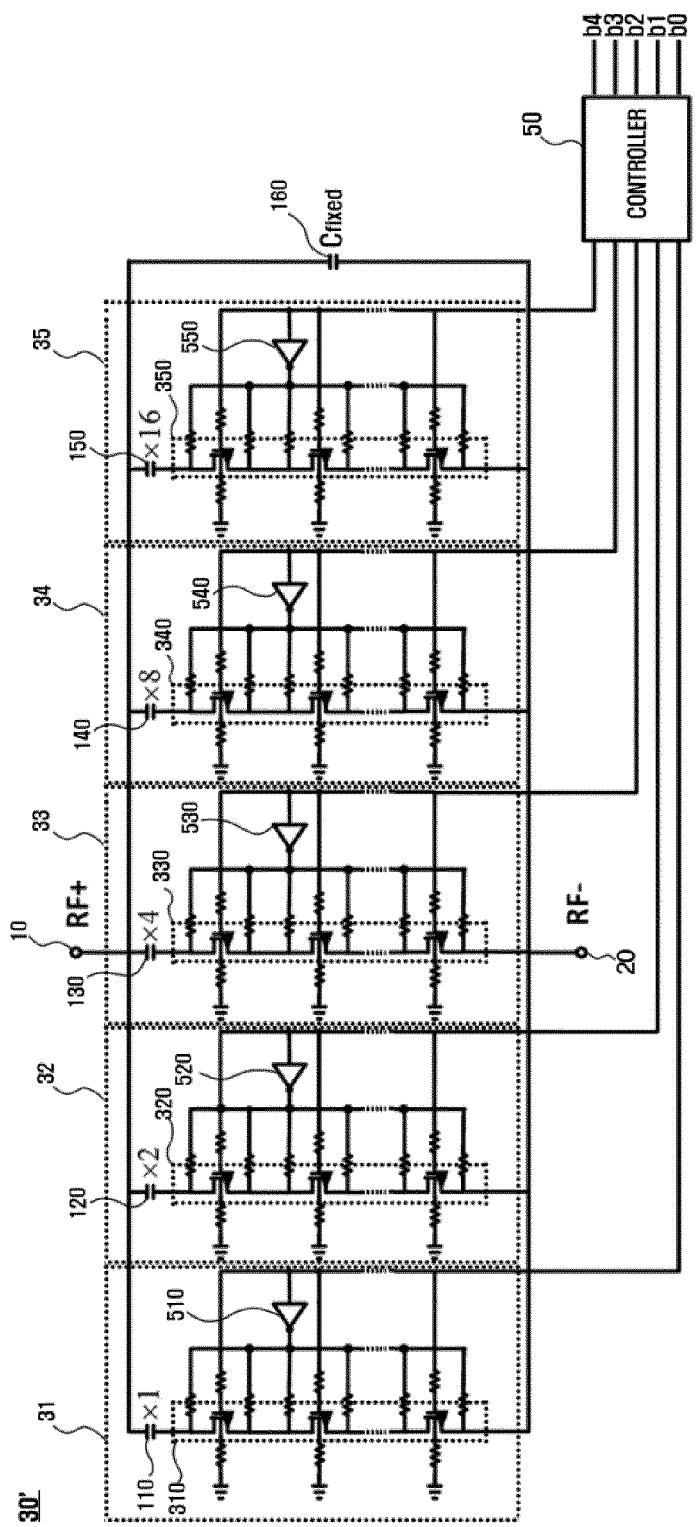
FIG. 12 is a circuit diagram showing a variable capacitor unit according to another embodiment of the present invention.

FIG. 12 shows a variable capacitor unit 30' unit according to another embodiment of the present invention.

Referring to FIG. 12, the variable capacitor unit 30' according to the embodiment of the present invention may further include a fixed capacitor (Cfixed) 160 added in parallel to the tunable capacitors 31, 32, 33, 34 and 35 which are connected in parallel to each other.

As shown in FIG. 12, even if none of the tunable capacitors 31, 32, 33, 34 and 35 which are connected in parallel to each other are selected, that is to say, even though all of the switching transistors 310, 320, 330, 340 and 350 become in the off-state, the capacitor between the first terminal 10 and the second terminal 20 may correspond to the fixed capacitor (Cfixed) 160.

As described above, according to the embodiment of the present invention, it is possible to easily implement the tunable capacitor capable of operating or tuning in the bypass mode. That is, the tunable capacitor includes the variable capacitor unit capable of tuning the capacitance between the first terminal 10 and the second terminal 20 and includes the bypass switch which bypasses between the first terminal 10 and the second terminal 20, so that it is easy to perform calibration for circuits or devices which are connected to the first terminal 10 or the second terminal 20. Also, the tunable capacitor includes the variable capacitor unit capable of tuning the capacitance between the first terminal 10 and the second terminal 20 and includes the tuning switch which controls the connection between the variable capacitor unit and the impedance tuner 40 placed between the ground terminal and either the first terminal 10 or the second terminal 20, so that it is possible to efficiently accomplish the impedance matching between the first terminal 10 and the second terminal 20.

Meanwhile, as described above, the voltage applied to the gate terminal G of the switching transistor is converted and then is applied to the source terminal S and the drain terminal D, so that it is possible to control the on/off of the switching transistor without generating a separate negative voltage. In other words, a response becomes faster and more accurate and the negative voltage is not used, and thus a negative voltage generator is not required. Accordingly, it is possible to overcome problems caused by the negative voltage generator, for example, sensitivity degradation, power consumption, space utilization and the like.

The features, structures and effects and the like described in the embodiments are included in at least one embodiment of the present invention and are not necessarily limited to one embodiment. Furthermore, the features, structures, effects and the like provided in each embodiment can be combined or modified in other embodiments by those skilled in the art to which the embodiments belong. Therefore, contents related to the combination and modification should be construed to be included in the scope of the present invention.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

What is claimed is:

1. A tunable capacitor comprising:
a first capacitor;
a switching transistor which switches on/off a connection of the first capacitor between a first terminal and a second terminal; and
a converter configured to convert a signal applied to a gate terminal G of the switching transistor and apply the converted signal to a drain terminal D and a source terminal S of the switching transistor,
wherein an on/off operation of the switching transistor is performed by a high signal H and a low signal L.

2. The tunable capacitor of claim 1, wherein when the switching transistor is in an on-state, a high signal H is applied to the gate terminal G, and a low signal L is applied to a body terminal B, the drain terminal D and the source terminal S, and wherein when the switching transistor is in an off-state, the low signal L is applied to the gate terminal G and the body terminal B, and the high signal H is applied to the drain terminal D and the source terminal S.

3. The tunable capacitor of claim 1, wherein the switching transistor is a stacked transistor formed by connecting in series a plurality of transistors.

4. The tunable capacitor of claim 1, wherein the gate terminal G and a body terminal B of the switching transistor are connected in series to a resistance respectively.

5. The tunable capacitor of claim 1, wherein the first capacitor is formed by connecting in series or in parallel a plurality of capacitors.

6. A tunable capacitor array comprising a plurality of the tunable capacitors according to claim 1, wherein the plurality of the tunable capacitors are connected in parallel to each other.

7. A tunable capacitor array comprising a plurality of the tunable capacitors according to claim 1, wherein the plurality of the tunable capacitors are connected in parallel to each other.

8. The tunable capacitor array of claim 6, wherein an equivalent capacitance of the plurality of the tunable capacitors is $2^{m-1} \times C1$ (here, m is a natural number less than or equal to n), wherein channel width-to-length ratios W/L of the switching transistors of the plurality of the tunable capacitors are $2^{m-1} \times W1$ (here, m is a natural number less than or equal to n) respectively, and wherein the n is a number of the tunable capacitors, wherein the C1 is an equivalent capacitance of a particular tunable capacitor, and wherein the W1 is a channel width-to-length ratio W/L of the switching transistor.

9. The tunable capacitor array of claim 6, further comprising a fixed capacitor which is connected in parallel to a plurality of the tunable capacitors.

10. The tunable capacitor array of claim 8, further comprising a fixed capacitor which is connected in parallel to a plurality of the tunable capacitors.

11. The tunable capacitor array of claim 6, further comprising a controller which receives a digital control signal and controls on/off of the switching transistor.

12. The tunable capacitor array of claim 8, further comprising a controller which receives a digital control signal and controls on/off of the switching transistor.

13. A tunable capacitor comprising:
a first capacitor;
a switching transistor which switches on/off a connection of the first capacitor between a first terminal and a second terminal; and
a converter configured to convert a signal applied to a gate terminal G of the switching transistor and apply the converted signal to a drain terminal D and a source terminal S of the switching transistor,
wherein an on/off operation of the switching transistor is performed by a high signal H and a low signal L, and
wherein the tunable capacitor is integrated on one semiconductor die or on one module.

14. The tunable capacitor of claim 13, wherein when the switching transistor is in an on-state, a high signal H is applied to the gate terminal G, and a low signal L is applied to a body terminal B, the drain terminal D and the source terminal S, and wherein when the switching transistor is in an off-state, the low signal L is applied to the gate terminal G and the body terminal B, and the high signal H is applied to the drain terminal D and the source terminal S.

15. The tunable capacitor of claim 13, wherein the switching transistor is a stacked transistor formed by connecting in series a plurality of transistors.

16. The tunable capacitor of claim 13, wherein the gate terminal G and a body terminal B of the switching transistor are connected in series to a resistance respectively.

17. The tunable capacitor of claim 13, wherein the first capacitor is formed by connecting in series or in parallel a plurality of capacitors.

18. A tunable capacitor array comprising a plurality of the tunable capacitors according to claim 13, wherein the plurality of the tunable capacitors are connected in parallel to each other.

19. A tunable capacitor array comprising a plurality of the tunable capacitors according to claim 13, wherein the plurality of the tunable capacitors are connected in parallel to each other.

20. The tunable capacitor array of claim 18, wherein an equivalent capacitance of the plurality of the tunable capacitors is $2^{m-1} \times C1$ (here, m is a natural number less than or equal to n), wherein channel width-to-length ratios W/L of the switching transistors of the plurality of the tunable capacitors are $2^{m-1} \times W1$ (here, m is a natural number less than or equal to n) respectively, and wherein the n is a number of the tunable capacitors, wherein the C1 is an equivalent capacitance of a particular tunable capacitor, and wherein the W1 is a channel width-to-length ratio W/L of the switching transistor.

21. The tunable capacitor array of claim 18, further comprising a fixed capacitor which is connected in parallel to a plurality of the tunable capacitors.

22. The tunable capacitor array of claim 20, further comprising a fixed capacitor which is connected in parallel to a plurality of the tunable capacitors.

23. The tunable capacitor array of claim 18, further comprising a controller which receives a digital control signal and controls on/off of the switching transistor.

24. The tunable capacitor array of claim 20, further comprising a controller which receives a digital control signal and controls on/off of the switching transistor.

* * * * *